United States Patent [19]

Matsuura

[11] Patent Number: 4,849,721
[45] Date of Patent: Jul. 18, 1989

[54] BANDPASS FILTER FOR A CATV CONVERTER

[75] Inventor: Syuuji Matsuura, Ikoma, Japan

[73] Assignee: Sharp Kabushiki Kaisha, Osaka, Japan

[21] Appl. No.: 204,213

[22] Filed: Jun. 8, 1988

Related U.S. Application Data

[63] Continuation of Ser. No. 849,156, Apr. 6, 1986, abandoned, Continuation of Ser. No. 77,989, Jul. 24, 1987, abandoned.

[30] Foreign Application Priority Data

Apr. 26, 1985 [JP] Japan .............................. 60-63947[U]

[51] Int. Cl.⁴ ............................................... H03H 7/12
[52] U.S. Cl. ................................... 333/174; 333/175;
455/191; 455/195
[58] Field of Search .................... 455/3, 6, 191, 193,
455/195; 333/174, 175, 168

[56] References Cited

U.S. PATENT DOCUMENTS

| | | | |
|---|---|---|---|
| 4,247,953 | 1/1981 | Shinagawa et al. | 455/191 |
| 4,291,290 | 9/1981 | Ijichi et al. | 455/191 X |
| 4,408,348 | 10/1983 | Theriault | 455/191 |
| 4,442,548 | 4/1984 | Lehmann | 455/195 |
| 4,584,544 | 4/1986 | Hettiger | 333/174 |
| 4,612,571 | 9/1986 | Moon | 333/174 |

FOREIGN PATENT DOCUMENTS

| | | | |
|---|---|---|---|
| 0073118 | 6/1980 | Japan | 333/174 |
| 0147024 | 11/1980 | Japan | 334/15 |
| 0097715 | 6/1982 | Japan | 333/168 |
| 1580369 | 12/1980 | United Kingdom | 334/15 |

Primary Examiner—Eugene R. LaRoche
Assistant Examiner—Seung Ham
Attorney, Agent, or Firm—Flehr, Hohbach, Test, Albritton & Herbert

[57] ABSTRACT

A bandpass filter for a CATV converter is of the structure with a low-pass filter section with low-pass filters connected longitudinally in a plurality of stages and a high-pass filter section, and comprises a variable trap circuit including a varactor and an inductor, and another varactor connected to one of the capacitors belonging to the low-pass filter section. Capacitances of these varactors are controlled by a tuning voltage so as to eliminate the various problems which would occur in a double-balance mixer to be connected at a later stage in the CATV converter.

3 Claims, 2 Drawing Sheets

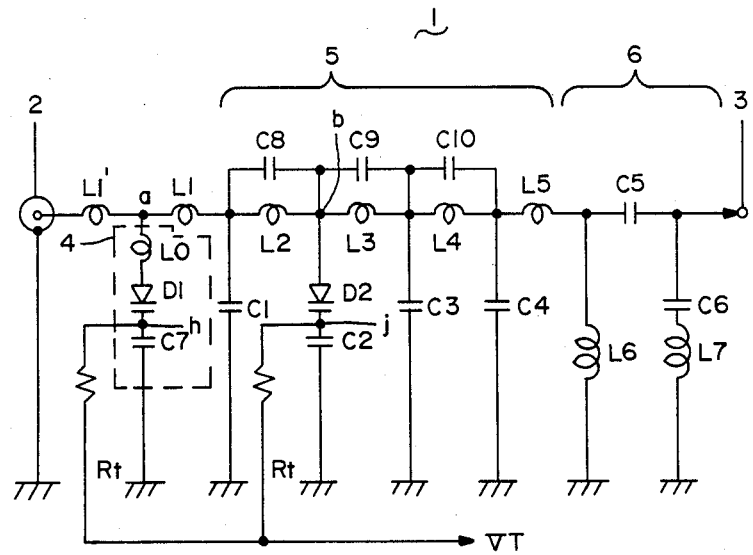
FIG.—1
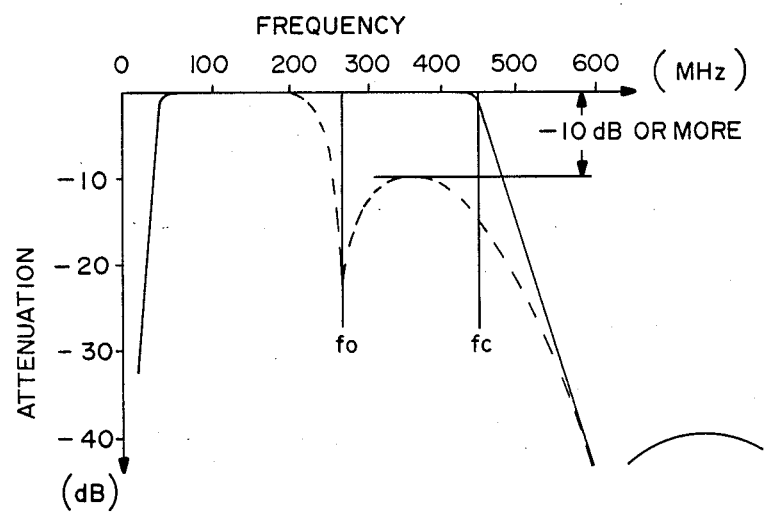
FIG.—2

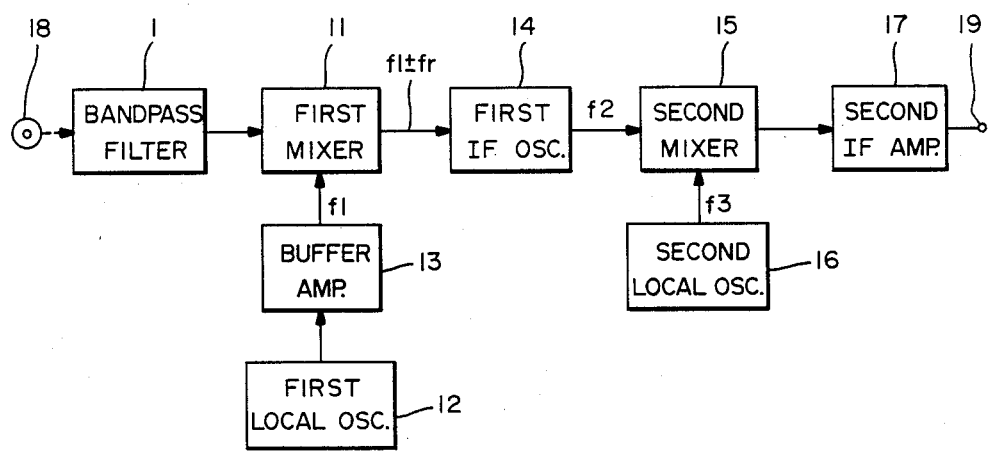
FIG.—3
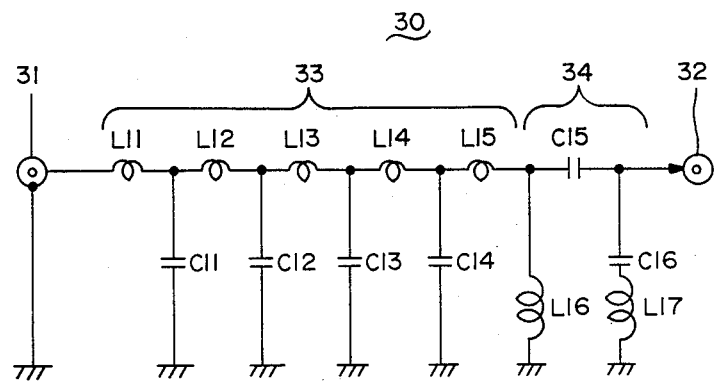
FIG.—4

BANDPASS FILTER FOR A CATV CONVERTER

This is a continuation, of application Ser. No. 849,156 filed Apr. 7, 1986 (abandoned. This is a continuation, of application Ser. No. 077,989 filed July 24, 1987 (now abandoned).

BACKGROUND OF THE INVENTION

This invention relates to a bandpass filter for a community antenna television (CATV) converter.

Reference being made to FIG. 4 showing an example of bandpass filter which was previously designed for a CATV converter during the course of research leading to the present invention, the bandpass filter 30 comprises a constant-K low-pass filter section 33 wherein inductors $L_{11}$–$L_{15}$ and capacitors $C_{11}$–$C_{14}$ are longitudinally connected in a plurality of stages and a high-pass filter section 34 composed of a constant-K filter with an inductor $L_{16}$ and a capacitor $C_{15}$ and an inductive M-type filter with an inductor $L_{17}$ connected between an input terminal 31 and an output terminal 32. The low-pass filter section 33 may be designed, for example, to have a pass zone of 0–450 MHz, a damping zone 470 MHz and over and a cutoff frequency 470 MHz. The high-pass filter section 34 may likewise be designed to have a damping zone 50 MHz and below and a cutoff frequency 50 MHz.

In the United States, tuners are tested under the condition that 64 wave signals mutually separated by 6 MHz are present at a fixed input level ($-6\,dB_{mv}$ to $+15\,dB_{mv}$) within the range from 55.25 MHz to 445.25 MHz. It is generally considered undesirable to input a signal to an active element at an input level of $+15\,dB_{mv}$ or greater because of the occurrence of intermodulations, crossmodulations, backtalks, local leakages, spurious responses at the input terminals, etc. When a bandpass filter of the type shown in FIG. 4 is used, therefore, a high-capacity mixer such as a double-balance mixer is used at a later stage. But the double-balance mixer is in the form of a bridge with four paired diodes, and since it requires a balloon transformer with good phase balancing, it cannot be mass-produced easily. Moreover, an empirical procedure and balance adjustments are required for maintaining a spurious response level of $-60dB$ or greater.

SUMMARY OF THE INVENTION

It is therefore an object of the present invention to provide a bandpass filter for a CATV converter capable of frequency modulation of input signal levels inputted to a double-balance mixer connected at a later stage in order to reduce the burden on it and also to eliminate the problems described above.

The above and other objects of the present invention are attained by providing a new bandpass filter for a CATV converter composed of low-pass filters in a plurality of stages connected longitudinally and a high-pass filter. One of the capacitors in the low-pass filters is connected to a first variable-capacity element as well as to a variable trap circuit consisting of a second variable-capacity element and an inductor wherein the capacitances of these first and second variable capacitors are controlled by a tuning voltage. Varactors may be used as the variable-capacity elements mentioned above.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 1 is a circuit diagram of a bandpass filter for a CATV converter according to the present invention, FIG. 2 is the attenuation characteristics of the bandpass filter of FIG. 1, FIG. 3 is a block diagram showing the bandpass filter of FIG. 1 used in a tuner for a CATV converter, and FIG. 4 is a circuit diagram of a bandpass filter previously considered.

DETAILED DESCRIPTION OF THE INVENTION

In FIG. 1, numeral 1 generally indicates a bandpass filter for a CATV converter with a low-pass filter section 5 and a high-pass filter section 6 connected between an input terminal 2 and an output terminal 3. The low-pass filter section 5 is of the structure of longitudinally connected inductive M-type filters with capacitors $C_1$–$C_4$ and $C_8$–$C_{10}$ and inductors $L_2$–$L_5$. The high-pass filter section 6, on the other hand, includes a constant-K filter with an inductor $L_6$ and a capacitor $C_5$ and an inductive M-type filter with capacitors $C_5$ and $C_6$ and an inductor $L_7$.

According to the present invention, two inductors $L_1'$ and $L_1$ for matching are connected in series between the input terminal 2 and the first-stage low-pass filter of the filter circuit described above. In addition, there are inserted between a junction point a of the two matching inductors $L_1'$ and $L_1$ ' and the ground a variable trap circuit 4 consisting of a first inductor $L_0$, a first varactor $D_1$ and a capacitor $C_7$ which are connected in series. A second varactor $D_2$ is connected between a junction b on the input side of the second-stage low-pass filter and the capacitor $C_2$. A tuning voltage $V_T$ is adapted to be applied respectively through a resistor $R_t$ to a junction point h between the first varactor $D_1$ and the capacitor $C_7$ and to a junction point j between the second varactor $D_2$ and the capacitor $C_2$.

The bandpass filter 1 of FIG. 1 uses the tuning voltage $V_T$ in the variable trap circuit 4 to make the resonance characteristics variable. Although it is theoretically preferable to have as wide a variable range as possible for the series resonance frequency $f_0$ of this variable trap circuit 4, it is generally about 200 MHz in view of the increase in the return loss. the tuning voltage $V_T$ further makes the cutoff frequency $f_c$ variable by means of the circuit consisting of the inductors $L_1$ and $L_2$, the second varactor $D_2$ and the capacitor $C_2$.

FIG. 2 shows an example of attenuation characteristics of this bandpass filter when a tuning voltage $V_T$ is applied to the first varactor $D_1$ and the second varactor $D_2$. It is seen that the characteristics curve is flat as shown by a solid line for the case of W+25 channel (445.25 MHz) reception but that the curve, as shown by a dotted line, has two hills controlled by the series resonance frequency $f_0$ and the cutoff frequency $f_c$ in the case of US2 channel (55.25 MHz) reception. In the range between $f_0$ and $f_c$, the attenuation characteristics are greater than $-10$ dB.

Alternatively, the circuit consisting of the matching inductors $L_1'$ and $L_1$, the inductor $L_0$, the first varactor $D_1$ and the capacitor $C_7$ may be inserted between the low-pass filter section 5 and the high-pass filter section 6 but such a circuit is disadvantageous in view of the leakage of oscillation signals from a first local oscillator to be described below.

FIG. 3 shows an example of tuner for a CATV converter using a bandpass filter of the type described above. Reference being made now to FIG. 3, a TV signal distributed from a CATV cable is inputted from an input terminal 18, passes through the bandpass filter 1 of the present invention and is inputted to a first mixer 11 as a TV signal $f_r$. In the meantime, an oscillation signal from a first local oscillator 12 is inputted to the first mixer 11 through a buffer amplifier 13 as an oscillator frequency signal $f_1$. The first mixer 11 is a balanced mixer with four diodes connected in a bridge-like formation and the output signal from it is a sideband wave $f_1 \pm f_r$ with the oscillator frequency signal $f_1$ suppressed. This signal is selectively amplified by a first intermediate frequency (IF) amplifier 14 and only the portion $f_1 + f_r$ is outputted to a second mixer 15 as a first IF signal $f_2$. The first IF signal $f_2$ is mixed with an oscillator frequency signal $f_3$ from a second local oscillator 16 in the second mixer 15 and is frequency-converted into the VHF band. It is finally outputted to an output terminal 19 after it is selectively amplified again by a second IF amplifier 17. This output signal from the output terminal 19 is what is supplied to an antenna terminal (not shown) of a TV receiver.

With a bandpass filter of the present invention, significant improvements can be realized regarding secondary and tertiary spurious responses near the low channels, composite triple beats, intermodulation, crossmodulation, etc. Although a spurious signal (backtalk) in the reception signal band, which is caused by the difference between the oscillator signal $f_1$ from the first local oscillator and the TV signal $f_r$, leaks to the input terminal, an improvement by over 30 dB was obtained in the relative ratio of input signals. Improvements were further effected regarding leakage of the oscillator signal $f_2$ from the second local oscillator at the input terminal.

In summary, various problems which occur in the double-balance mixer at a later stage can be eliminated by using a bandpass filter for a CATV converter according to the present invention. Burden on the mixer circuit characteristics can be reduced and the spurious level can be lowered.

The foregoing description of a preferred embodiment of the invention has been presented for illustration and description. It is not intended to be exhaustive or to limit the invention to the precise form disclosed, and obviously many modifications and variations are possible in light of the above teachings. Such modifications and variations which may be apparent to a person skilled in the art are intended to be included within the scope of the invention.

What is claimed is:

1. A bandpass filter for a CATV converter having a low-pass filter section with low-pass filters including capacitors and connected longitudinally in a plurality of stages and a high-pass filter section, said bandpass filter comprising:
   an input terminal,
   an output terminal,
   two matching inductors connected in series between said input terminal and said low-pass filter section,
   a variable trap circuit connected to a junction point between said two matching inductors and having a series resonance frequency, said variable trap circuit including a first variable-capacity element and an inductor, and
   a second variable-capacity element connected to one of said capacitors of said low-pass filter section, capacitance values of said first and second variable-capacity elements being controlled by a tuning voltage, the cutoff frequency of said bandpass filter being adjustably set to about 450 MHz and said series resonance frequency being about 250 MHz such that the filter characteristic of said bandpass filter is flat at W+25 channel reception and has peaks approximately at said series resonance frequency and said cutoff frequency at US2 channel reception.

2. The bandpass filter of claim 1 wherein said first and second variable-capacity elements are each a varactor.

3. The bandpass filter of claim 1 having attenuation characteristics greater than −10 db between said series resonance frequency and said cutoff frequency.

* * * * *